United States Patent [19]

Welland

[11] Patent Number: 5,055,846
[45] Date of Patent: Oct. 8, 1991

[54] METHOD FOR TONE AVOIDANCE IN DELTA-SIGMA CONVERTERS

[75] Inventor: David R. Welland, Austin, Tex.

[73] Assignee: Crystal Semiconductor Corporation, Austin, Tex.

[21] Appl. No.: 622,369

[22] Filed: Dec. 5, 1990

Related U.S. Application Data

[63] Continuation of Ser. No. 257,057, Oct. 13, 1988, abandoned.

[51] Int. Cl.$^5$ ............................................. H03M 1/06
[52] U.S. Cl. ................................. 341/155; 341/118; 341/143
[58] Field of Search ................ 341/118, 120, 143, 155

[56] References Cited

U.S. PATENT DOCUMENTS

| | | | |
|---|---|---|---|
| 3,562,420 | 2/1971 | Thompson | 178/6 |
| 4,017,849 | 4/1977 | Tewksbury | 341/143 |
| 4,224,571 | 9/1980 | Dijkmans | 341/143 |
| 4,301,446 | 11/1981 | Petit | 341/143 |
| 4,375,013 | 2/1983 | Cointot et al. | 341/143 |
| 4,509,037 | 4/1985 | Harris | 340/347 |
| 4,542,354 | 9/1985 | Robinton et al. | 341/143 |
| 4,588,981 | 5/1986 | Senn | 341/143 |
| 4,614,936 | 9/1986 | Weidenbruch et al. | 341/166 |
| 4,704,600 | 11/1987 | Uchimura et al. | 341/144 |
| 4,746,899 | 5/1988 | Swanson et al. | 341/155 |

OTHER PUBLICATIONS

Lee, W. et al., "A Topology for Higher Order Interpolative Coders", IEEE, 1987.

Uchimura, K. et al., "VLSI- A to D and D to A Converters with Multi-Stage Noise Shaping Modulators", Proceedings of IEEE-IECEJ-ASJ International Conference on Acoustics, Speech, and Signal Processing, Apr. 7–11, 1986, pp. 1545–1548.

Adams, R., "Design and Implementation of an Audio 18-Bit A/D Converter Using Oversampling Techniques", 78th Convention of the Audio Engineering Society, May 3–6, 1985.

Scott, J., "CMOS Implementation of an Immediately Adaptive Delta Modulator", Master's Thesis, Massachusetts Institute of Technology, May 1985.

*Primary Examiner*—A. D. Pellinen
*Assistant Examiner*—Marc S. Hoff
*Attorney, Agent, or Firm*—Leonard & Lott

[57] ABSTRACT

The quantization noise in a delta-sigma converter can produce correlated noise when the converter is operating. This correlated noise can produce tones in the frequency band of interest. In a departure from conventional wisdom these tones are substantially eliminated by the degration of the signal-to-noise ratio at the input of the comparator in the delta-sigma converter. In the preferred embodiment this degradation of the signal-to-noise ratio is accomplished by attenuating the input signal to the comparator such that the input signal becomes comparable to the noise generated in the input stage of the comparator.

12 Claims, 2 Drawing Sheets

METHOD FOR TONE AVOIDANCE IN DELTA-SIGMA CONVERTERS

This is a continuation of copending application, Ser. No. 257,057, filed on Oct. 13, 1988, now abandoned.

TECHNICAL FIELD OF THE INVENTION

The present invention pertains in general to delta-sigma converters and, more particularly, to methods and apparatus for avoiding unwanted tones in delta-sigma converters.

BACKGROUND OF THE INVENTION

Analog-to-digital (A/D) conversion circuits which utilize delta-sigma converters have several distinct advantages over other types of A/D converter circuits and are used in such applications as digital recordings of audio signals which require A/D conversion circuits which have excellent signal-to-noise (S/N) characteristics.

A type of noise inherent in any A/D conversion system is the noise which results from the quantization of the analog signal. While for many applications the quantization noise can be assumed to have a white spectral content, i.e., uncorrelated noise spectrum, in actuality the quantization noise signals can be correlated. This correlation can occur when a delta-sigma type of A/D converter enters a limit cycle, and during these times the output of the A/D converter will exhibit tones. These tones are very undesirable if they fall in the frequency band of interest.

While limit cycles occur most prominently in first order delta-sigma converters, higher order converters are not entirely free of the limit cycles. In the past dither signals have been added at various points in the delta-sigma converter loop in an attempt to break up the limit cycles. However, since the dither signal itself is deterministic, it cannot entirely eliminate the possibility of limit cycles.

Therefore it can be appreciated that an apparatus and method for attenuating or breaking up undesirable tones in the frequency band of interest resulting from the correlation of the quantization noise in a delta-sigma converter is highly desirable.

SUMMARY OF THE INVENTION

It is therefore an object of this invention to provide a delta-sigma converter which is relatively immune to tones normally produced by the quantization noise in prior art delta-sigma converter.

Shown in an illustrated embodiment of the invention is a method for breaking up tones in the frequency band of interest resulting from the correlation of the quantization noise in a delta-sigma converter by decreasing the signal-to-noise ratio at a node in the delta-sigma converter.

In a further aspect of the invention the decrease in the signal-to-noise ratio is accomplished by selecting components in order to provide a signal level at the node such that the noise inherent at the node is sufficient to break up tones in the frequency band of interest resulting from the correlation of the quantization noise in the delta-sigma converter.

Also shown in an illustrated embodiment of the invention is a delta-sigma converter which has improved immunity to tones in the frequency band of interest resulting from the correlation of the quantization noise by including circuitry to decrease the signal-to-noise ratio at a node in the delta-sigma converter.

In a further aspect of the invention the circuitry for decreasing the signal-to-noise ratio comprises a passive device coupled between the node and a reference voltage.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
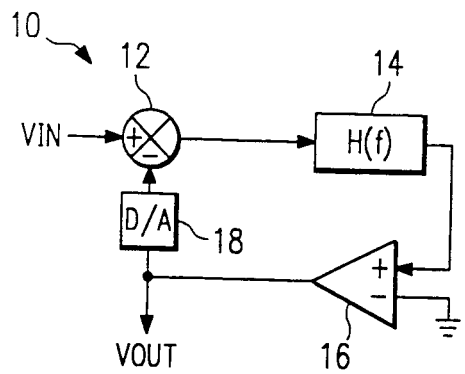
FIG. 1 is a block diagram of a delta-sigma converter.

It will be appreciated that for purposes of clarity and where deemed appropriate, reference numerals have been repeated in the figures to indicate corresponding features.

DESCRIPTION OF THE PREFERRED EMBODIMENTS

A delta-sigma converter according to the preferred embodiment of the present invention is a fourth order delta-sigma converter in which the signal input into the quantizing circuit, the comparator, is attenuated such that the signal-to-noise ratio at the input to the comparator is low enough to break up tones in the frequency band of interest resulting from the correlation of the quantization noise in the delta-sigma converter. In the preferred embodiment the input signal into the comparator is approximately 10 millivolts or less and the noise level produced at the input stage of the comparator is approximately one-half of a millivolt, thus resulting in signal-to-noise ratio of approximately 40 to 1 or less. While the attenuation of the signal significantly degrades the signal-to-noise ratio at the input of the comparator as compared to other fourth order delta-sigma converters, this degraded signal-to-noise ratio provides only a very slight degradation in the overall performance of the delta-sigma converter since the architecture of the delta-signal converter is optimized to reject quantization noise and random noise in the comparator in the frequency band of interest.

In an alternative embodiment, an external noise source is added to the input of the comparator to thereby degrade the signal-to-noise ratio at the input of the comparator without attenuating the signal voltages in the delta-sigma modulator.

It will be appreciated that the present invention does not eliminate limit cycles, but rather breaks up the correlation of the limit cycles to thereby reduce or in some cases eliminate tones produced by these limit cycles in the frequency band of interest. Stated another way, the present invention operates to break up the limit cycles of the delta-sigma converter in a manner to decrease the probability that undesirable tones will be generated in the quantization process of the delta-sigma converter.

Turning now to the drawings, FIG. 1 shows a first order delta-sigma converter 10 in which an analog signal, VIN, is input into a summer node 12 the output of which is connected to the input of a filter 14, and the output of the filter 14 is connected to the positive input of a comparator 16. The negative input of the comparator 16 is connected to ground and the output of the comparator 16 forms the digital output signal VOUT. The output of the comparator 16 is also connected to the input of a single bit digital-to-analog (D/A) converter 18, the output of which is connected to the summing node 12. In a typical A/D converter using the present invention, the delta-sigma converter 10 oversamples the input signal VIN, and the digital output VOUT of the delta-sigma converter is coupled to the input of a digital decimation filter to form the digital data stream.

In operation, the analog signal VIN is summed with the output of the D/A converter 18 at the summing node 12 and fed into the filter 14. The filter 14 has transfer characteristics represented by H(f) and is typically an integrator. The output of the filter 14 is then compared in the comparator 16 to ground and the digital output of the comparator 16 forms the output signal VOUT which in turn is coupled into the input of the D/A converter 18. Thus the input signal is periodically sampled and each sample is combined with the output of the D/A converter 18 and this algebraic sum is passed to the input of the filter 14 which integrates the present value with the previous value from the summing node 12, and this output is compared to ground in the comparator 16, the output of which forms VOUT and also selects the next analog voltage to be summed with the next sample of the input signal at the summing node 12. This operation is conventional and well known in the art.

Figure 2:
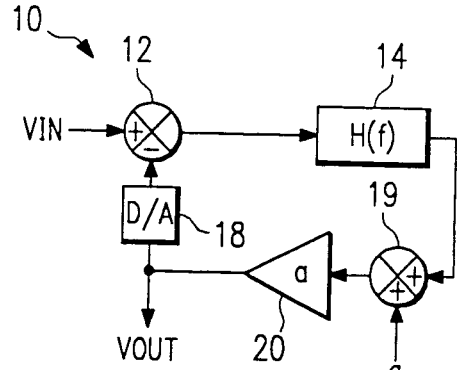
FIG. 2 is the block diagram of FIG. 1 in which the comparator has been replaced by an equivalent circuit.

The comparator 16, which is the quantizing element in the delta-sigma converter loop, produces quantization noise. The comparator 16, for purposes of the following analysis, can be shown as the combination of an equivalent quantization noise source q, a summer 19, and a linear amplifier 20 as shown in FIG. 2. The equivalent quantization noise source q is combined with the output of the filter 14 in the summer 19, the output of which is amplified in the linear amplifier 20. In the following transfer function equations, the presence of the D/A converter 18 is ignored since the D/A conversion process is essentially a voltage shifting operation.

$$VOUT = [H(VIN - VOUT) + q]a$$
$$= [aH/(1 + aH)][VIN + q/H]$$
$$\approx VIN + q/H(f)$$

Thus, the quantization noise q at the input of the comparator 16 is divided by the transfer function of the filter 14. Advantageously, however, not only the quantization noise but any other noise present at the input of the comparator 16 is likewise divided by the inverse of the transfer function of the filter 14.

Figure 3:
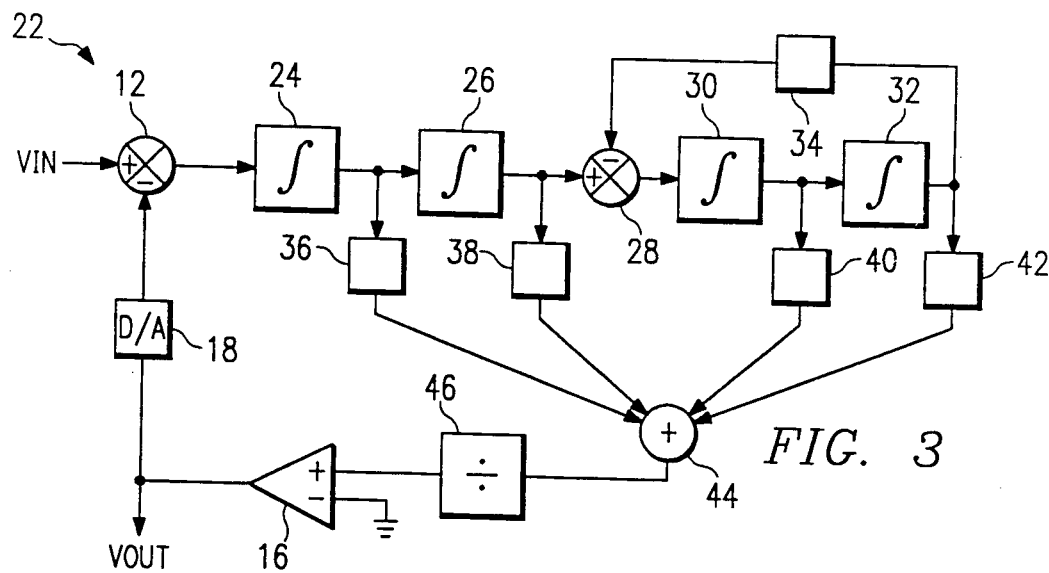
FIG. 3 is a block diagram of the preferred embodiment of a delta-sigma converter according to the present invention.

Turning now to FIG. 3 a fourth order delta-sigma converter 22 according to the preferred embodiment of the present invention is shown. In the fourth order delta-sigma converter 22 shown in FIG. 3 the output of the summer 12 is input to a first integrator 24, and the output of the first integrator is in turn connected to the input of a second integrator 26; and the output of the integrator 26 is connected to one input of a summer 28. The output of the summer 28 is connected to the input of a third integrator 30, and the output of the integrator 30 is connected to input of a fourth integrator 32. A feedback element 34 is connected between the output of the fourth integrator 32 and another input of the summer 28. Connected to the outputs of each of the integrators 24, 26, 30, and 32 is a separate feedforward element 36, 38, 40, and 42 respectively. The outputs of each of the feedforward elements 36, 38, 40, and 42 is summed together in another summer 44 and the output of the summer 44 is connected to the input of an attenuator 46 the output of which is connected to the positive input of the comparator 16. Of particular importance to the present invention is the attenuator 46 which operates to attenuate the signal into the comparator 16 such that the signal becomes comparable to the noise generated in the input stage of the comparator 16.

Figure 4:
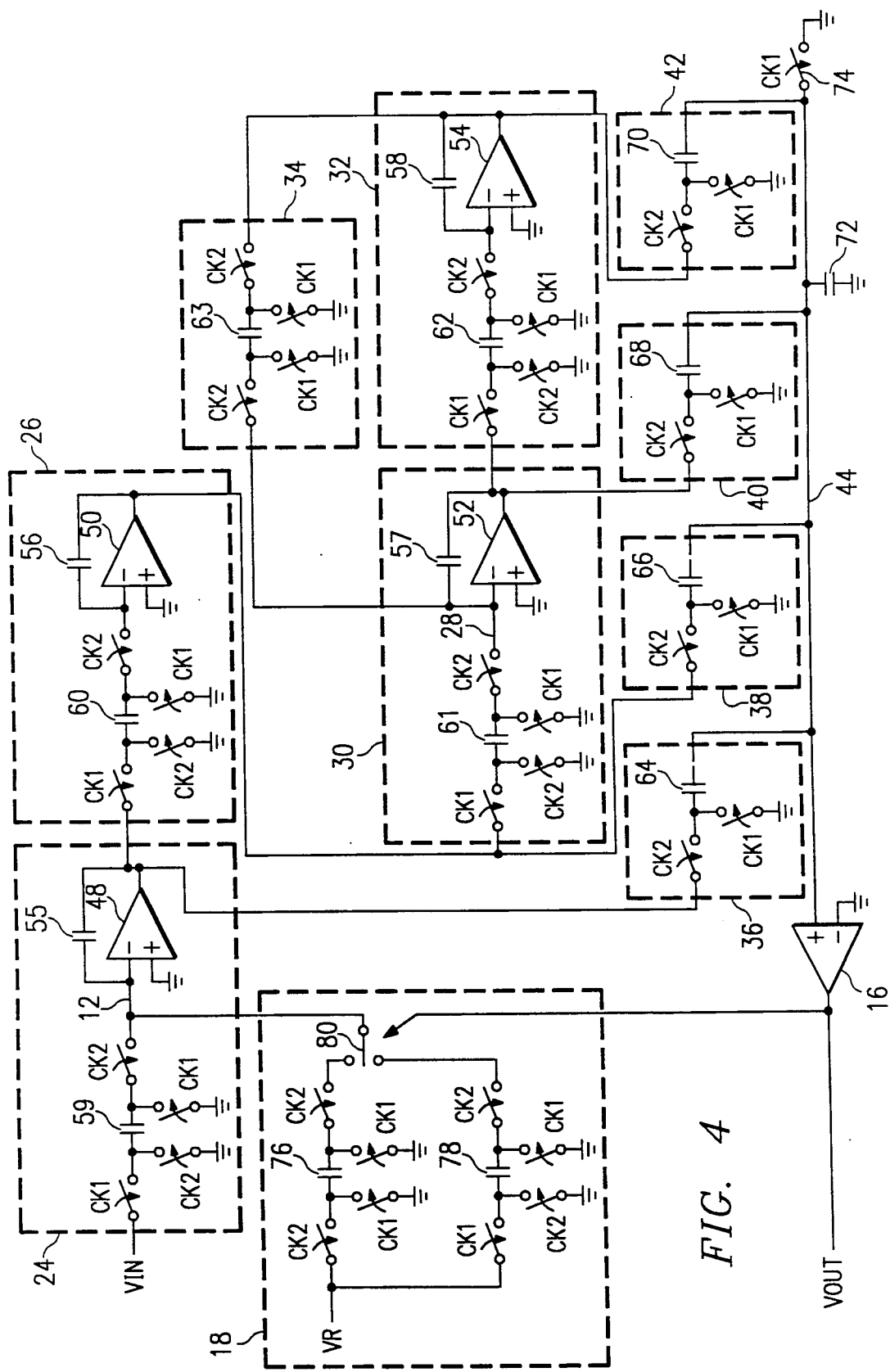
FIG. 4 is a circuit diagram of the delta-sigma converter shown in FIG. 3.

FIG. 4 is a circuit diagram of the delta-sigma converter shown in FIG. 3. As shown in FIG. 4 each of the integrators 24, 26, 30, and 32 consist of an operational amplifier 48, 50, 52, and 54 respectively which in turn have a feedback capacitor 55, 56, 57, and 58 respectively connected between their output terminals and the negative input terminals of the operational amplifiers. Each of the integrators 24, 26, 30, and 32 have a switched input capacitor 59, 60, 61, and 62 respectively. Each of these input capacitors has a first terminal which is alternately switched between ground and to the output stage in the case of the capacitors 60, 61, and 62 or to VIN in the case of capacitor 59. Each of these input capacitors has a second terminal which is alternately switched between ground and the input of the respective operational amplifier. The feedback element 34 contains a series capacitor 63, the first terminal of which is alternatively switched between ground and the summing node 28 formed at the minus input of the operational amplifier 52, and the second terminal of which is alternatively switched between ground and the output of the operational amplifier 54.

Each of the feedforward elements 36, 38, 40, and 42 contain a series capacitor 64, 66, 68, and 70 respectively. The first terminal of each of these capacitors 64, 66, 68, and 70 is alternately switched between the output of the integrators 24, 26, 30, and 32 respectively or ground. The second terminal of these capacitors 64, 66, 68, and 70 is connected to the summing node 44. Also connected to the summing node 44 is an additional capacitor 72, the second terminal of which is connected to ground. The summing node 44 is selectively switched to ground by a switch 74.

The D/A converter 18 consists of two capacitors, a first capacitor 76 and a second capacitor 78. The first terminal of the capacitor 76 is alternately switched between a reference voltage VR and ground. The second terminal of capacitor 76 is alternately switched between ground and one input of another switch 80. The first terminal of the capacitor 78 is alternately switched between ground and VR. The second terminal of the capacitor 78 is alternately switched between ground and another terminal of the switch 80. The armature of the switch 80 is connected to the negative input of the comparator 48 which forms the summing node 12. The switch 80 is controlled by the output of the comparator 16 such that the output of the comparator 16 is used to connect the capacitor 76 or the capacitor 78 to the summing node 12.

The operation of each of the integrators 24, 26, 30, and 32 is well known to those skilled in the art in that during a first clock phase (CK1) the input capacitors are charged either by VIN or by the output from the previous stage while the second terminals of the input capacitors are grounded and isolated from the negative inputs of the respective operational amplifiers. During the second clock phase (CK2), which alternates with the first clock phase and does not overlap the first clock phase, the first terminals of the input capacitors 59, 60, 61, and 62 are grounded and the second terminals are connected to the minus inputs of the respective operational amplifiers which causes a charge transfer from the input capacitors to the feedback capacitors in each of the integrators. Thus the integrators 24, 26, 30, and 32 form a series charge transfer path. The capacitor 63 of the feedback element 34 is grounded on both sides during the first clock cycle and then connected between the output of the operational amplifier 54 and the negative input of the operational amplifier 52.

Each of the feedforward element capacitors 64, 66, 68, and 70 has its first terminal grounded during the first clock phase and its first terminal connected to the output of each of the integrators 24, 26, 30, and 32 respectively during the second clock phase. Thus the feedforward elements 36, 38, 40, and 42 form a charge transfer path between the outputs of the respective integrators and the summing node 44.

The summing node 44 is grounded during the first clock phase by the switch 74. The capacitors 76 and 78 operate in a similar manner as the other input capacitors 59, 60, 61, and 62 and the output of the respective capacitor selected by the switch 80 is summed at the summing node 12 with the input signal VIN.

Thus, during the first clock phase the input capacitors for each of the integrators 24, 26, 30, and 32 and the capacitors 76 and 78 are precharged while the capacitors 64, 66, 68, 70, 72, and 76 are discharged. During the second clock phase the charge on the input capacitors 59, 60, 61, and 62 and one of the capacitors 76 or 78 is transferred to the input of their respective operational amplifiers and the feedback capacitors in each of the integrators receives the same amount of charge held by each of the respective input capacitors, the capacitor 63 is connected between the output of the integrator 32 and the input of the integrator 30 and at the same time each of the outputs from the integrators 24, 26, 30, and 32 is transferred through the capacitors 64, 66, 68, and 70 to the summing node 44. This charge transferred to the summing node 44 is shared between each of the capacitors 64, 66, 68, 70, and capacitor 72 which operates to attenuate the charge and therefore the signal into the comparator 16. Therefore in each cycle of operation, which consists of clock phase 1 and clock phase 2, the input signal VIN is sampled and the charge is transferred from each previous stage to the next stage of the integrators 24, 26, 30, and 32. Also, the output from each of the integrators 24, 26, 30, and 32 is summed at the summing node 44 and attenuated to provide the input to the comparator 16. As stated previously, the signal level into the comparator 16 is selected to be no more than 10 millivolts in the preferred embodiment.

The feedback capacitor 63 provides a conjugate pair of poles in the overall filter transfer function which are located to optimize the quantization noise. The feedforward capacitors 64, 66, 68, and 70 are necessary for stable operation of the converter. Also, while not shown in the drawings, it will be understood that additional circuitry is used in the preferred embodiment to detect excessively high voltage levels in the integrators as an indication of unstable operation, and if such levels are detected the integrators are reset to a stable or normal operation. In practice, the reset circuitry is never utilized except at power-up or during periods when the input is excessively high. Excessively high means much higher than the full scale. Further, since the input to the comparator 16 is attenuated to a voltage level lower than normal, care must be taken in designing the comparator 16 to avoid hysteresis which would worsen the stability in the delta-signal converter.

In the preferred embodiment the delta-sigma converter is fabricated in a CMOS integrated circuit in which V+ is +5 volts and V− is −5 volts and VR is −3.6 volts. As stated above, the input signal to the comparator 16 on the summing node 44 is on the order of 10 millivolts at its peak value.

Figure 5:
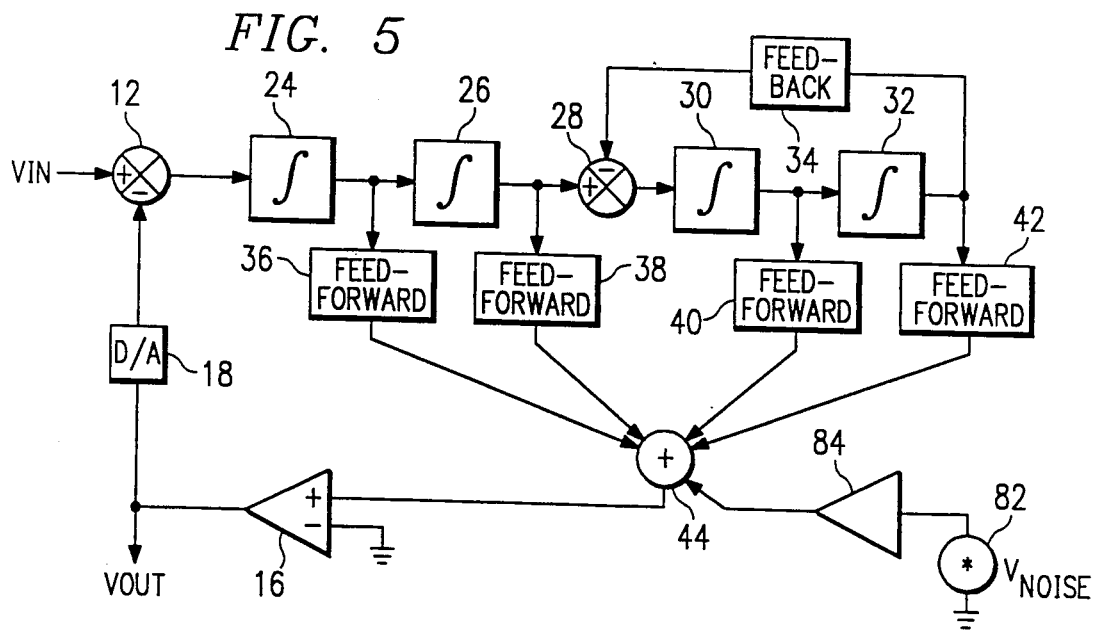
FIG. 5 is a block diagram of an alternative embodiment of a delta-sigma converter according to the present invention.

An alternative embodiment for the present invention is shown in FIG. 5 in which the decrease in the signal-to-noise ratio is accomplished by the addition of a random noise source 82 which is amplified by an amplifier 84 and added to the summer 44. In this circuit the signal input into the comparator 16 is kept within the range of several volts and the magnitude of the noise output out of the amplifier 84 is chosen to provide the amount of noise which is effective to break up the correlation of the quantization noise without severely degrading the overall signal noise ratio of the delta-sigma converter.

Thus, there has been described a delta-sigma converter which is effective in breaking up the correlation of the quantization noise to thereby significantly diminish the tones generated in the quantization process.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein. For example, the degradation of the signal-to-noise ratio in the preferred embodiment occurs at the input to the comparator 16. However, other nodes in the loop of the delta-sigma converter could also be used as points of signal-to-noise degradation. Moreover, although the preferred embodiment is a fourth order delta-sigma converter, other orders of delta-sigma converters can also take advantage of the present invention.

What is claimed is:

1. In a delta-sigma converter, the improvement comprising: limiting the maximum signal-to-noise ratio at a node in said delta-sigma converter by, at least in part, attenuating the signal level at said node such that during normal operation the noise level is sufficient to significantly reduce tones in the frequency band of interest which result from the correlation of the quantization noise in said delta-sigma converter.

2. The improvement set forth in claim 1 wherein said node is the signal input node to a quantization circuit in said delta-sigma converter.

3. The improvement set forth in claim 1 wherein the attenuating the signal level at said node is caused, at least in part, by the addition of a capacitive element coupled between said node and a reference potential.

4. The improvement set forth in claim 1 wherein the maximum signal-to-noise ratio is approximately 40 to 1.

5. In a delta-sigma converter, the improvement comprising: limiting the maximum signal-to-noise ratio at a node in said delta-sigma converter by injecting noise into said node such that during normal operation the noise level is sufficient to significantly reduce tones in the frequency band of interest which result from the correlation of the quantization noise in said delta-sigma converter.

6. The improvement set forth in claim 5 wherein said node is the signal input node to a quantization circuit in said delta-sigma converter.

7. In a delta-sigma converter having a feedback loop the improvement comprising: limiting the signal-to-noise ratio at a node inside of the feedback loop of said delta-sigma converter by attenuating the signal level at said node such that the signal-to-noise ratio at said node is generally never greater than 100 to 1 during normal operation of said delta-sigma converter.

8. In a delta-sigma converter having a feedback loop the improvement comprising: limiting the maximum signal-to-noise ratio at a node inside of the feedback loop of said delta-sigma converter by limiting the signal level at said node to be generally never greater than 100 millivolts during normal operation of said delta-sigma converter.

9. A delta-sigma converter comprising:
 a) a plurality of integrators coupled together to form a series charge transfer path;
 b) a like plurality of feedforward elements, each forming a charge transfer path between an output of one of said plurality of integrators and a summing node, wherein each of said feedforward elements comprises a capacitor in series with said charge transfer path of said feedforward elements; and
 c) a shunt capacitor coupled between said summing node and a reference voltage.

10. In a delta-sigma converter having a feedback loop the improvement comprising: limiting the signal-to-noise ratio at a node inside of the feedback loop of said delta-sigma converter by attenuating the signal level at said node such that the signal-to-noise ratio at said node is generally never greater than 40 to 1 during normal operation of said delta-sigma converter.

11. In a delta-sigma converter, the improvement comprising: limiting the maximum signal-to-noise ratio at a node in said delta-sigma converter by, at least in part, increasing the noise into said node such that during normal operation the noise level is sufficient to significantly reduce tones in the frequency band of interest which result from the correlation of the quantization noise in said delta-sigma converter.

12. The improvement set forth in claim 11 wherein said delta-sigma converter includes a comparator having an input stage which includes said node.

* * * * *